United States Patent [19]
Choi

[11] Patent Number: 5,708,623
[45] Date of Patent: Jan. 13, 1998

[54] SEMICONDUCTOR MEMORY DECODER DEVICE

[75] Inventor: Jae Myoung Choi, Ichon, Rep. of Korea

[73] Assignee: Hyundai Electronics Industries Co., Ltd., Kyoungki-do, Rep. of Korea

[21] Appl. No.: 735,655

[22] Filed: Oct. 24, 1996

[30] Foreign Application Priority Data

Oct. 25, 1995 [KR] Rep. of Korea .................. 1995-37053

[51] Int. Cl.$^6$ ............................................ G11C 7/00
[52] U.S. Cl. ............... 365/233; 365/230.06; 365/230.03; 365/230.04
[58] Field of Search .................. 365/233, 230.06, 365/230.03, 230.04, 193, 230.08

[56] References Cited

U.S. PATENT DOCUMENTS

| | | | |
|---|---|---|---|
| 4,758,992 | 7/1988 | Taguchi | 365/222 |
| 5,241,510 | 8/1993 | Kobayashi | 365/230.08 |
| 5,257,233 | 10/1993 | Schafer | 365/193 |
| 5,392,239 | 2/1995 | Margulis et al. | 365/233 |
| 5,613,094 | 3/1997 | Khan | 365/193 |

*Primary Examiner*—A. Zarabian
*Attorney, Agent, or Firm*—Gary M. Nath; Nath & Associates

[57] ABSTRACT

A memory device comprising a cell array including first and second cell array blocks for storing data therein, a first row address buffer for generating a first internal row address signal in response to an external row address signal and a first row address strobe signal, a second row address buffer for generating a second internal row address signal in response to the external row address signal and a second row address strobe signal, a first pre-decoder for pre-decoding the first internal row address signal from the first row address buffer, a second pre-decoder for pre-decoding the second internal row address signal from the second row address buffer, a first row decoder for selectively driving word lines in the first cell array block in response to the pre-decoded first internal row address signal from the first pre-decoder, and a second row decoder for selectively driving word lines in the second cell array block in response to the pre-decoded second internal row address signal from the second pre-decoder. The memory device further comprises a row address strobe bar buffer for generating the first and second row address strobe signals in response to an external row address strobe bar signal, a column address strobe bar signal, a write enable signal, an output enable signal and a mode enable signal.

5 Claims, 10 Drawing Sheets

SEMICONDUCTOR MEMORY DECODER DEVICE

BACKGROUND OF THE INVENTION

1. Field of the Invention

The present invention relates in general to memory devices, and more particularly to a memory device which is capable of reducing the time required to access memory cells and perform a high-speed operation.

2. Description of the Prior Art

A conventional memory device will hereinafter be mentioned with reference to FIGS. 1 and 2.

FIG. 1 is a block diagram illustrating the construction of a conventional memory device. As shown in FIG. 1, the conventional memory device comprises a cell array 11 including a plurality of memory cells for storing data therein, a row address strobe bar buffer (referred to hereinafter as /RAS buffer) 15 for generating an internal row address strobe signal ras in response to an external row address strobe bar signal /RAS, a column address strobe bar signal /CAS, a write enable signal /WE and an output enable signal /OE, an address buffer 14 for generating an internal row address signal AXi in response to an external row address signal and the internal row address strobe signal ras from the /RAS buffer 15, a pre-decoder 13 for pre-decoding the internal row buffer 15, a pre-decoder 13 for pre-decoding the internal row address signal AXi from the address buffer 14, and a row decoder 12 for decoding the pre-decoded internal row address signal AXij from the pre-decoder 13 and selecting one of word lines in the cell array 11 corresponding to the decoded result.

FIG. 2 is a timing diagram illustrating the operation of the conventional memory device in FIG. 1. As shown in this drawing, the external row address strobe bar signal /RAS is low in logic for time tRAS. At this time, the address buffer 14 generates the internal row address signal AXi in response to the external row address signal and the internal row address strobe signal ras from the /RAS buffer 15. The pre-decoder 13 pre-decodes the internal row address signal AXi from the address buffer 14 and outputs the pre-decoded internal row address signal AXij to the row decoder 12. Then, the row decoder 12 decodes the pre-decoded internal row address signal AXij from the pre-decoder 13 and selects one of the word lines in the cell array 11 corresponding to the decoded result. As a result, data are read or written from or into the memory cells of the selected word line. In contrast, the external row address strobe bar signal /RAS is high in logic for time tRP because it remains at its precharged state.

As mentioned above, time of tRAS+tRP is required in reading or writing one cell data. In other words, one cell data is accessed for each cycle of the external row address strobe bar signal /RAS, thereby causing a very long time to be required in testing a high-density memory device. Particularly, in a memory device of the giga or more class, a substantial amount of time is required for checking the entire cell state and characteristic, due to the very long test time. Such a significant amount of test time results in an increase in the cost in view of mass production.

SUMMARY OF THE INVENTION

Therefore, the present invention has been made in view of the above problem, and it is an object of the present invention to provide a memory device which is capable of reducing the time required in accessing memory cells, to reduce the test time and perform a high-speed operation.

In accordance with one aspect of the present invention, there is provided a memory device comprises a cell array including first and second cell array blocks for storing data therein; a first row address buffer for generating a first internal row address signal in response to an external row address signal and a first row address strobe signal; a second row address buffer for generating a second internal row address signal in response to the external row address signal and a second row address strobe signal; a first pre-decoder for pre-decoding the first internal row address signal from the first row address buffer; a second pre-decoder for pre-decoding the second internal row address signal from the second row address buffer; a first row decoder for selectively driving word lines in the first cell array block in response to the pre-decoded first internal row address signal from the first pre-decoder; and a second row decoder for selectively driving word lines in the second cell array block in response to the pre-decoded second internal row address signal from the second pre-decoder.

The memory device further comprises control means for generating the first and second row address strobe signals in response to an external row address strobe bar signal, a column address strobe bar signal, a write enable signal, an output enable signal and a mode enable signal and applying the generated first and second row address strobe signals to the first and second row address buffers, respectively.

The first and second row decoders, the first and second row address buffers and the first and second pre-decoders are alternately operated.

In accordance with another aspect of the present invention, a memory device comprises a cell array including first and second cell array blocks for storing data therein; an address buffer for generating an internal row address signal in response to an external row address signal and an internal row address strobe signal; a pre-decoder for pre-decoding the internal row address signal from the address buffer; a first latch circuit for generating a first internal row address signal in response to the pre-decoded internal row address signal from the pre-decoder and a first row address strobe signal; a second latch circuit for generating a second internal row address signal in response to the pre-decoded internal row address signal from the pre-decoder and a second row address strobe signal; a first row decoder for selectively driving word lines in the first cell array block in response to the first internal row address signal from the first latch circuit; and a second row decoder for selectively driving word lines in the second cell array block in response to the second internal row address signal from the second latch circuit.

The memory device further comprises control means for generating the internal row address strobe signal and the first and second row address strobe signals in response to an external row address strobe bar signal, a column address strobe bar signal, a write enable signal, an output enable signal and a mode enable signal and applying the generated internal row address strobe signal and first and second row address strobe signals to the address buffer and first and second latch circuits, respectively.

The first and second row decoders are alternately operated and the first and second latch circuits are alternately operated.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
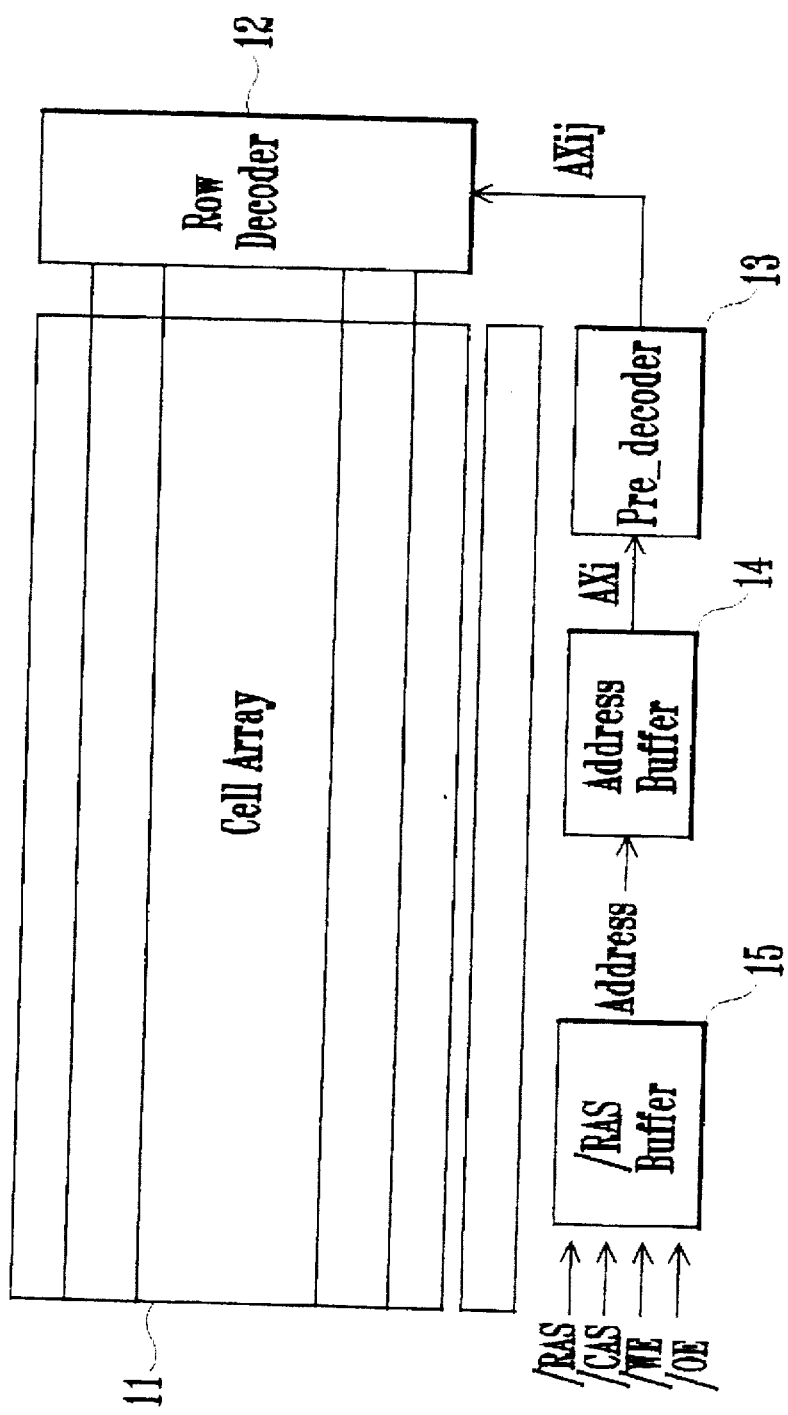
FIG. 1 is a block diagram illustrating the construction of a conventional memory device.
Figure 2:
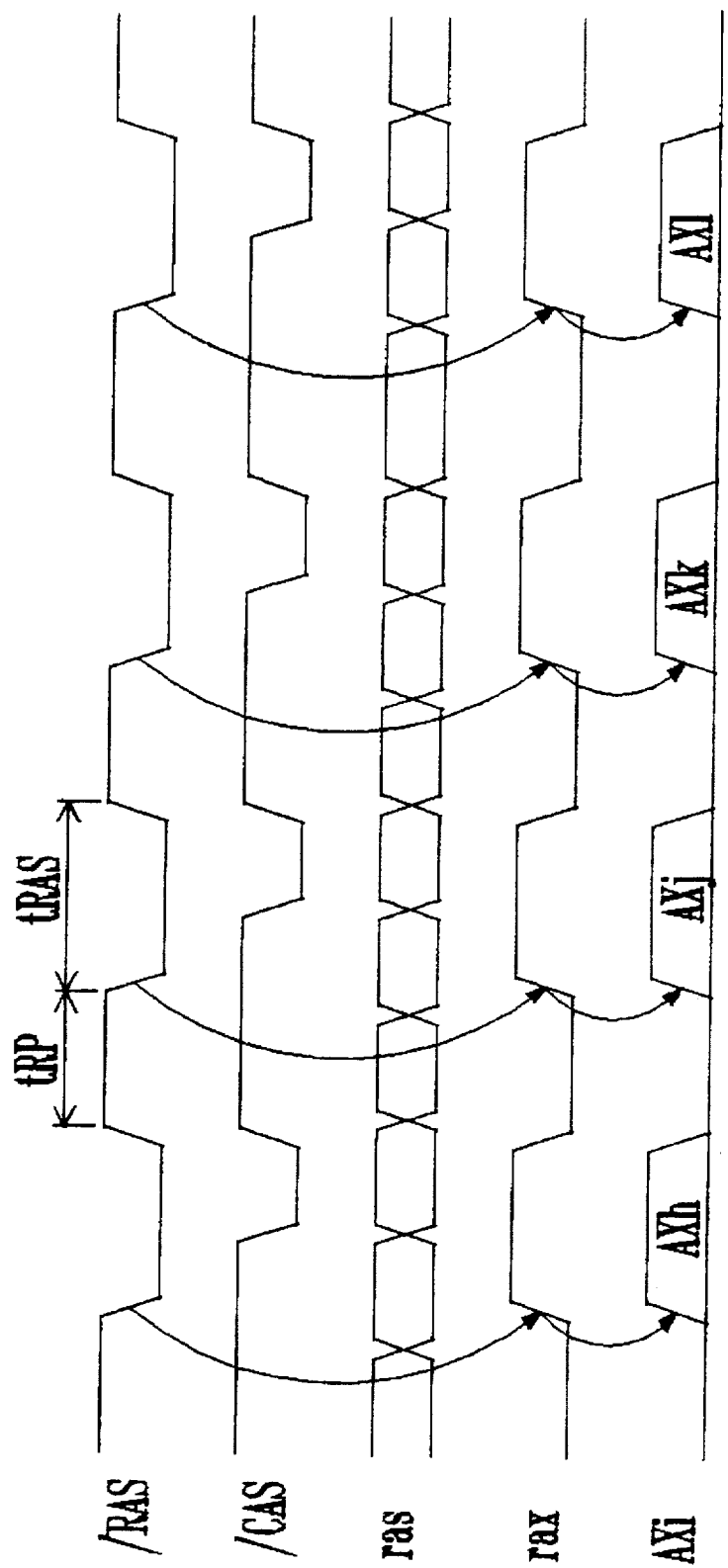
FIG. 2 is a timing diagram illustrating the operation of the conventional memory device in FIG. 1.
Figure 3:
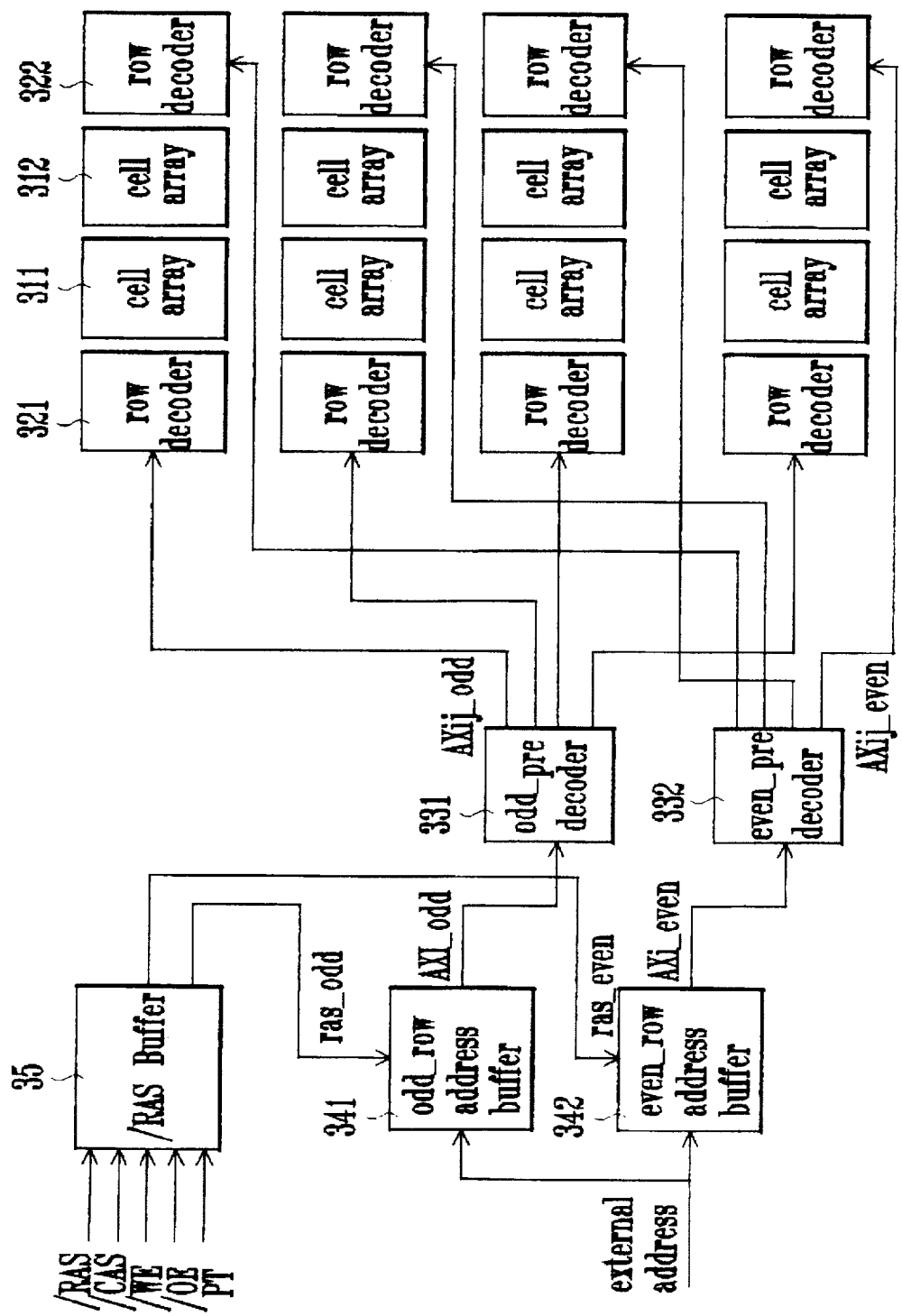
FIG. 3 is a block diagram illustrating the construction of a memory device in accordance with an embodiment of the present invention.

Referring to FIG. 3, the construction of a memory device in accordance with an embodiment of the present invention is shown in block form. As this drawing indicates, the memory device comprises a cell array 31 including odd and even cell array blocks 311 and 312 for storing data therein, and a /RAS buffer 35 for generating an odd row address strobe signal ras$_{13}$ odd and an even row address strobe signal ras_even in response to an external row address strobe bar signal /RAS, a column address strobe bar signal /CAS, a write enable signal /WE, an output enable signal /OE and a mode enable signal PT.

The memory device further comprises an odd row address buffer 341 for generating an odd internal row address signal AXi_odd in response to an external row address signal and the odd row address strobe signal ras_odd from the /RAS buffer 35, and an even row address buffer 342 for generating an even internal row address signal AXi_even in response to the external row address signal and the even row address strobe signal ras_even from the /RAS buffer 35.

The memory device further comprises an odd pre-decoder 331 for pre-decoding the odd internal row address signal AXi_odd from the odd row address buffer 341, an even pre-decoder 332 for pre-decoding the even internal row address signal AXi_even from the even row address buffer 342, an odd row decoder 321 for selectively driving word lines in the odd cell array block 311 in response to the pre-decoded odd internal row address signal from the odd pre-decoder 331, and an even row decoder 333 for selectively driving word lines in the even cell array block 312 in response to the pre-decoded even internal row address signal from the even pre-decoder 332.

The operation of the memory device with the above-mentioned construction in accordance with the embodiment of the present invention will hereinafter be described in detail.

First, all of the memory cells in the memory device are classified into two parts, or odd and even parts. The odd row address buffer 341 is provided to generate the odd internal row address signal AXi_odd to address the odd memory cells and the even row address buffer 342 is provided to generate the even internal row address signal AXi_even to address the even memory cells.

The odd internal row address signal AXi_odd from the odd row address buffer 341 is pre-decoded by the odd pre-decoder 331 and then applied to the odd row decoder 321. The even internal row address signal AXi_even from the even row address buffer 342 is pre-decoded by the even pre-decoder 332 and then applied to the even row decoder 322. As a result, the odd row decoder 321 is operated in response to the pre-decoded odd internal row address signal from the odd pre-decoder 331 to select the corresponding word line in the odd cell array block 311. Also, the even row decoder 322 is operated in response to the pre-decoded even internal row address signal from the even pre-decoder 332 to select the corresponding word line in the even cell array block 312.

Figure 4:
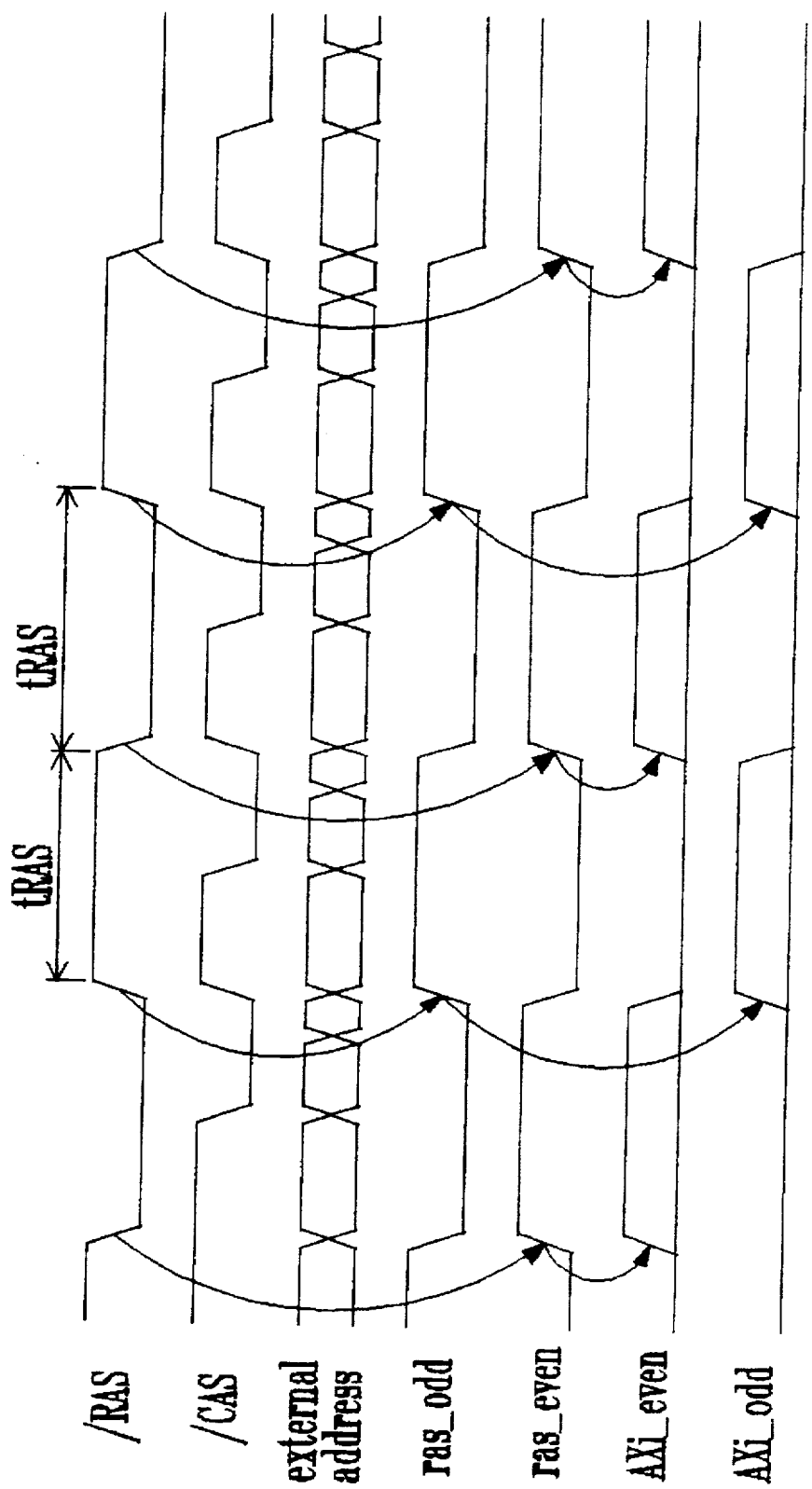
FIG. 4 is a timing diagram illustrating the operation of the memory device in FIG. 3.

FIG. 4 is a timing diagram illustrating the operation of the memory device in FIG. 3. As shown in this drawing, the odd and even internal row address signals AXi_odd and AXi_even are alternately generated for each cycle of the external row address strobe bar signal /RAS to alternately select the odd and even cell array blocks 311 and 312. Namely, when the external row address strobe bar signal /RAS is low in logic, the even row address buffer 342 is operated to access the even memory cells. In contrast, when the external row address strobe bar signal /RAS is high in logic, the odd row address buffer 341 is operated to access the odd memory cells. Therefore, whenever the external row address strobe bar signal /RAS is toggled in logic, the odd and even memory cells are alternately accessed so that data can be read or written therefrom or therein.

Figure 5:
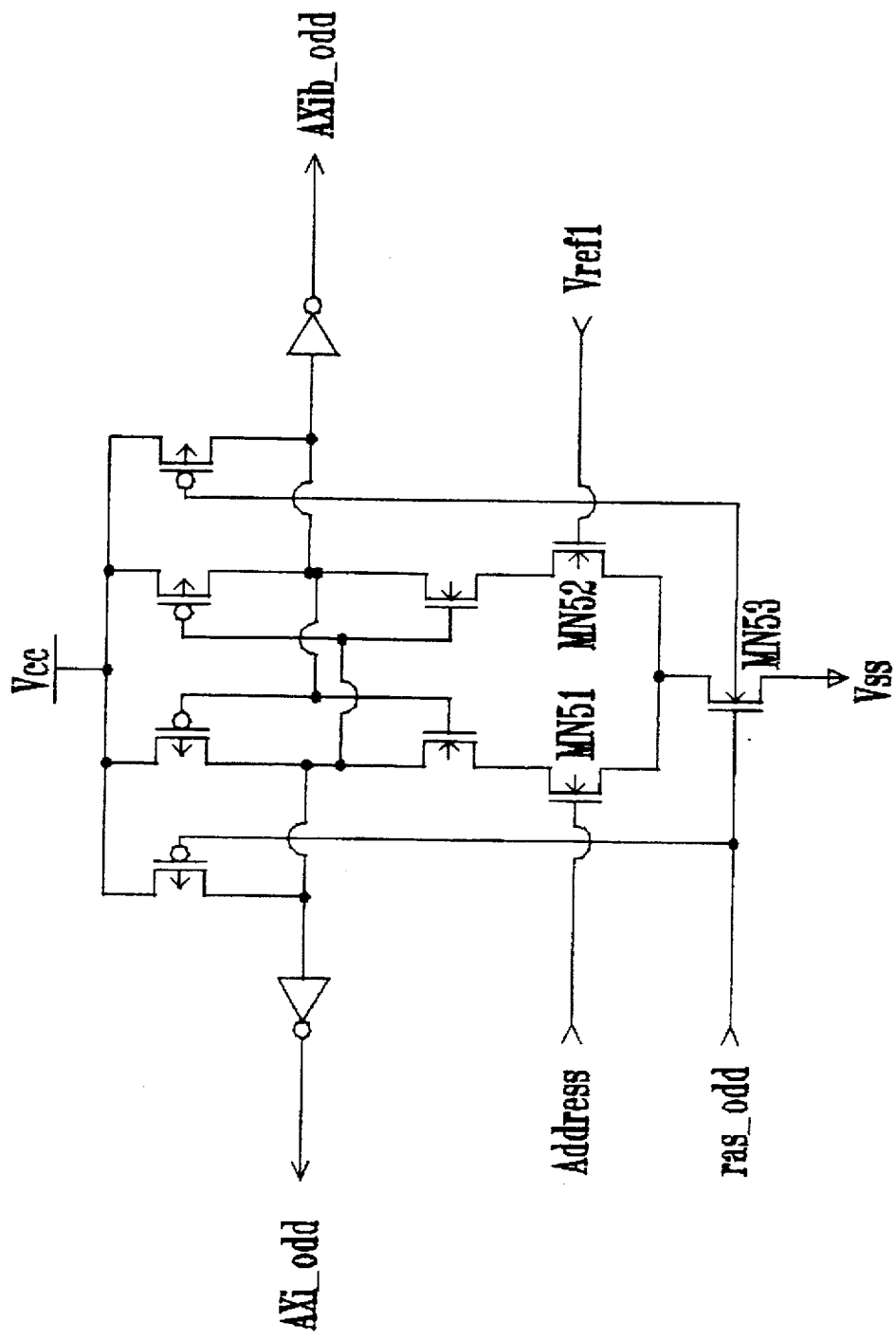
FIG. 5 is a circuit diagram of an odd row address buffer in FIG. 3.

FIG. 5 is a circuit diagram of the odd row address buffer 341 in FIG. 3. As shown in this drawing, the odd row address buffer 341 includes first to third NMOS transistors MN51-MN53. The first NMOS transistor MN51 has its gate for inputting the external row address signal Ai and the second NMOS transistor MN52 has its gate for inputting a first reference voltage Vref1. The third NMOS transistor MN53 has its gate for inputting the odd row address strobe signal ras_odd from the /RAS buffer 35.

The operation of the odd row address buffer 341 with the above-mentioned construction in accordance with the embodiment of the present invention will hereinafter be described in detail.

If the odd row address strobe signal ras_odd from the /RAS buffer 35 is high in logic, a gate voltage (external row address signal Ai) of the first NMOS transistor MN51 is compared with that (first reference voltage Vref1) of the second NMOS transistor MN52. When the gate voltage of the first NMOS transistor MN51 is higher than that of the second NMOS transistor MN52 as a result of the comparison, the odd row address buffer 341 generates the odd internal row address signal AXi_odd which is high in logic.

Figure 6:
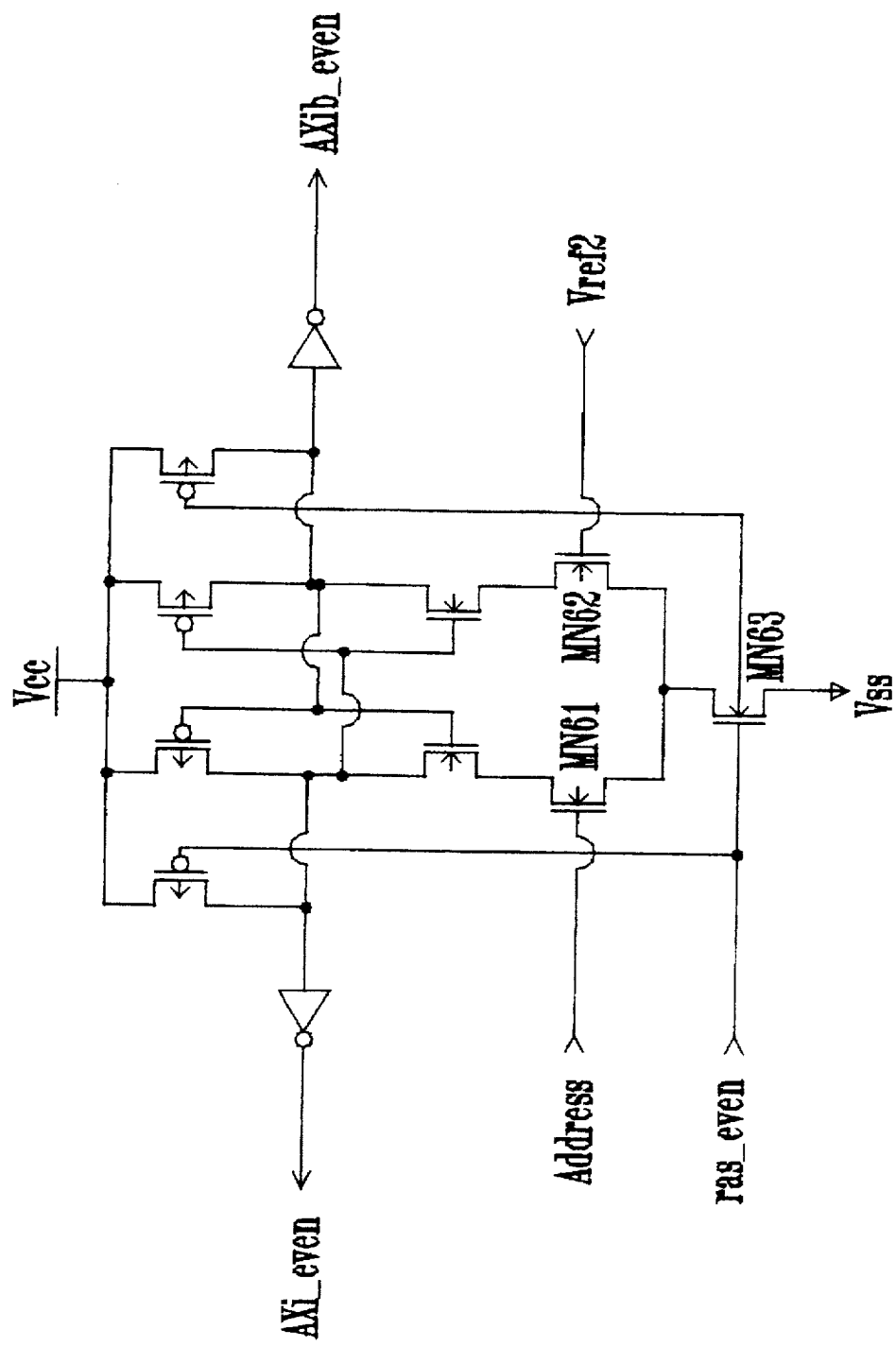
FIG. 6 is a circuit diagram of an even row address buffer in FIG. 3.

FIG. 6 is a circuit diagram of the even row address buffer 342 in FIG. 3. As shown in this drawing, the even row address buffer 342 includes first to third NMOS transistors MN61-MN63. The first NMOS transistor MN61 has its gate for inputting the external row address signal Ai and the second NMOS transistor MN62 has its gate for inputting a second reference voltage Vref2. The third NMOS transistor MN63 has its gate for inputting the even row address strobe signal ras_even from the /RAS buffer 35.

The operation of the even row address buffer 342 with the above-mentioned construction in accordance with the embodiment of the present invention will hereinafter be described in detail.

If the even row address strobe signal ras_even from the /RAS buffer 35 is high in logic, a gate voltage (external row address signal Ai) of the first NMOS transistor MN61 is compared with that (second reference voltage Vref2) of the second NMOS transistor MN62. When the gate voltage of the first NMOS transistor MN61 is higher than that of the second NMOS transistor MN62 as a result of the comparison, the even row address buffer 342 generates the even internal row address signal AXi_even which is high in logic.

Figure 7:
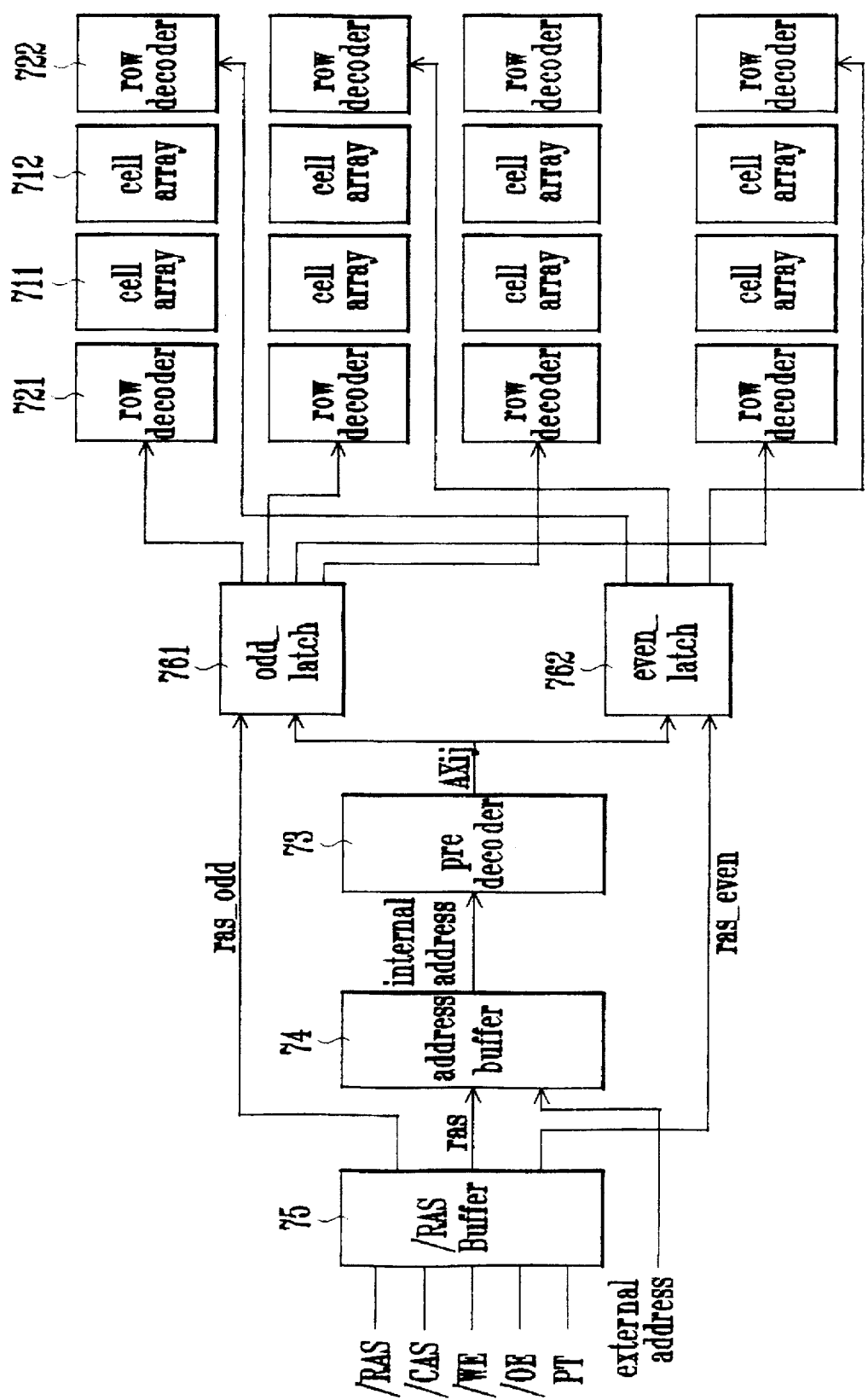
FIG. 7 is a block diagram illustrating the construction of a memory device in accordance with an alternative embodiment of the present invention.

Referring to FIG. 7, the construction of a memory device in accordance with an alternative embodiment of the present invention is shown in block form. As this drawing indicates, the memory device comprises a cell array 71 including odd and even cell array blocks 711 and 712 for storing data therein, a /RAS buffer 75 for generating an internal row address strobe signal ras, an odd row address strobe signal ras_odd and an even row address strobe signal ras_even in response to an external row address strobe bar signal /RAS, a column address strobe bar signal /CAS, a write enable signal /WE, an output enable signal /OE and a mode enable signal PT.

The memory device further comprises an address buffer 74 for generating an internal row address signal in response to an external row address signal and the internal row address strobe signal ras from the /RAS buffer 75, a pre-decoder 73 for pre-decoding the internal row address signal from the address buffer 74, an odd latch circuit 761 for generating an odd internal row address signal AXij_odd in response to the pre-decoded internal row address signal AXij from the pre-decoder 73 and the odd row address strobe signal ras_odd from the /RAS buffer 75, and an even latch circuit 762 for generating an even internal row address signal AXij_even in response to the pre-decoded internal row address signal AXij from the pre-decoder 73 and the even row address strobe signal ras_even from the /RAS buffer 75.

The memory device further comprises an odd row decoder 721 for selectively driving word lines in the odd cell array block 711 in response to the odd internal row address signal AXij_odd from the odd latch circuit 761, and an even row decoder 722 for selectively driving word lines in the even cell array block 712 in response to the even internal row address signal AXij_even from the even latch circuit 762.

The operation of the memory device with the above-mentioned construction in accordance with the alternative embodiment of the present invention will hereinafter be described in detail.

First, all of the memory cells in the memory device are classified into two parts, or odd and even parts. The odd latch circuit 761 is provided to generate the odd internal row address signal AXij_odd to address the odd memory cells and the even latch circuit 742 is provided to generate the even internal row address signal AXij_even to address the even memory cells.

In other words, the address buffer 74 generates the internal row address signal in response to the external row address signal and the pre-decoder 73 pre-decodes the internal row address signal from the address buffer 74. The pre-decoded internal row address signal AXij from the pre-decoder 73 is latched by the odd latch circuit 761 and then applied as the odd internal row address signal AXij_odd to the odd row decoder 721. Also, the pre-decoded internal row address signal AXij from the pre-decoder 73 is latched by the even latch circuit 762 and then applied as the even internal row address signal AXij_even to the even row decoder 722. As a result, the odd row decoder 721 is operated in response to the odd internal row address signal AXij_odd from the odd latch circuit 761 to select the corresponding word line in the odd cell array block 711. Also, the even row decoder 722 is operated in response to the even internal row address signal AXij_even from the even latch circuit 762 to select the corresponding word line in the even cell array block 712.

Figure 8:
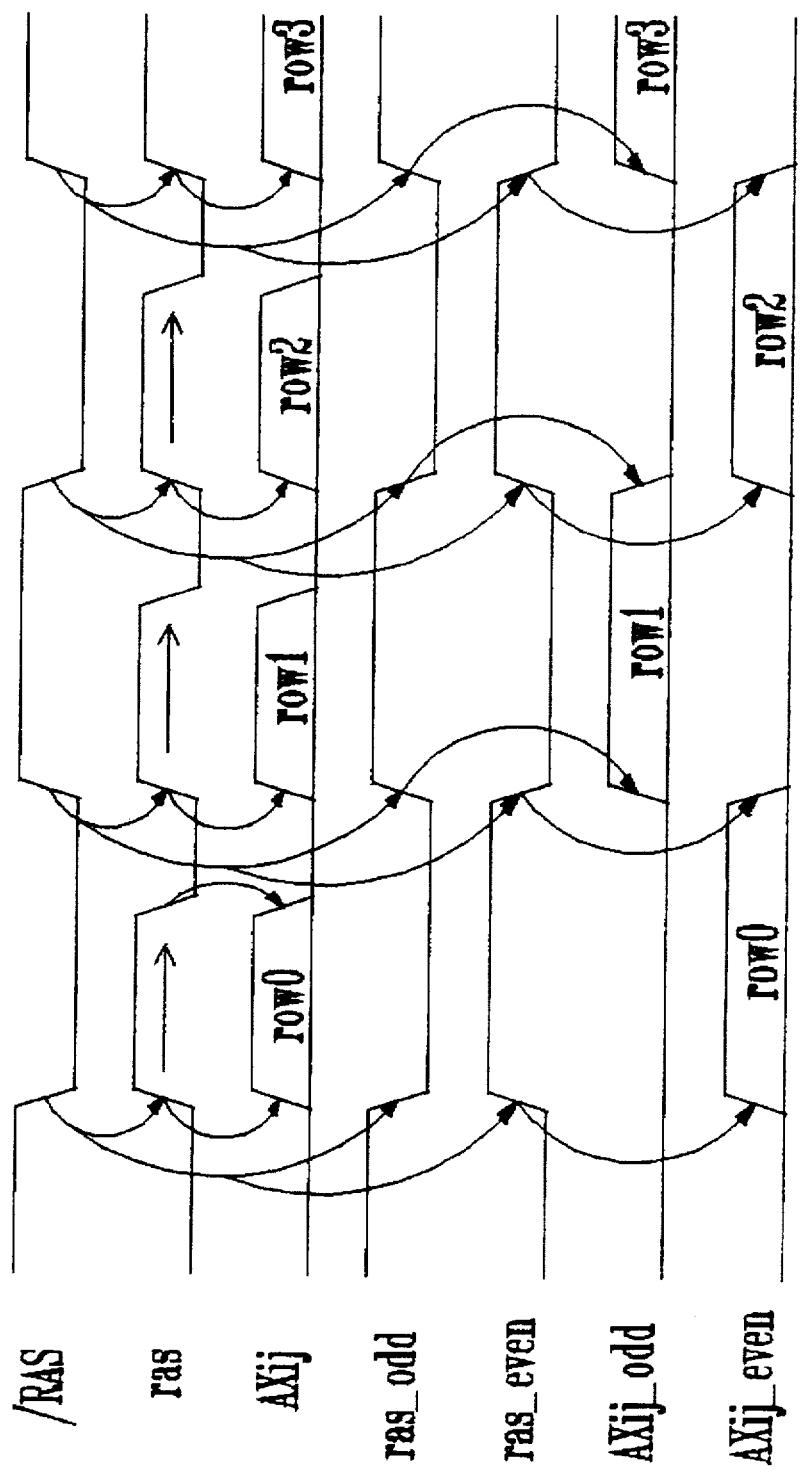
FIG. 8 is a timing diagram illustrating the operation of the memory device in FIG. 7.

FIG. 8 is a timing diagram illustrating the operation of the memory device in FIG. 7. As shown in this drawing, the odd and even internal row address signals AXij_odd and AXij_even are alternately generated for each cycle of the external row address strobe bar signal /RAS to alternately select the odd and even cell array blocks 711 and 712. Namely, when the external row address strobe bar signal /RAS is low in logic, the even latch circuit 762 is operated to access the even memory cells. To the contrary, when the external row address strobe bar signal /RAS is high in logic, the odd latch circuit 761 is operated to access the odd memory cells. Therefore, whenever the external row address strobe bar signal /RAS is toggled in logic, the odd and even memory cells are alternately accessed so that data can be read or written therefrom or therein.

Figure 9:
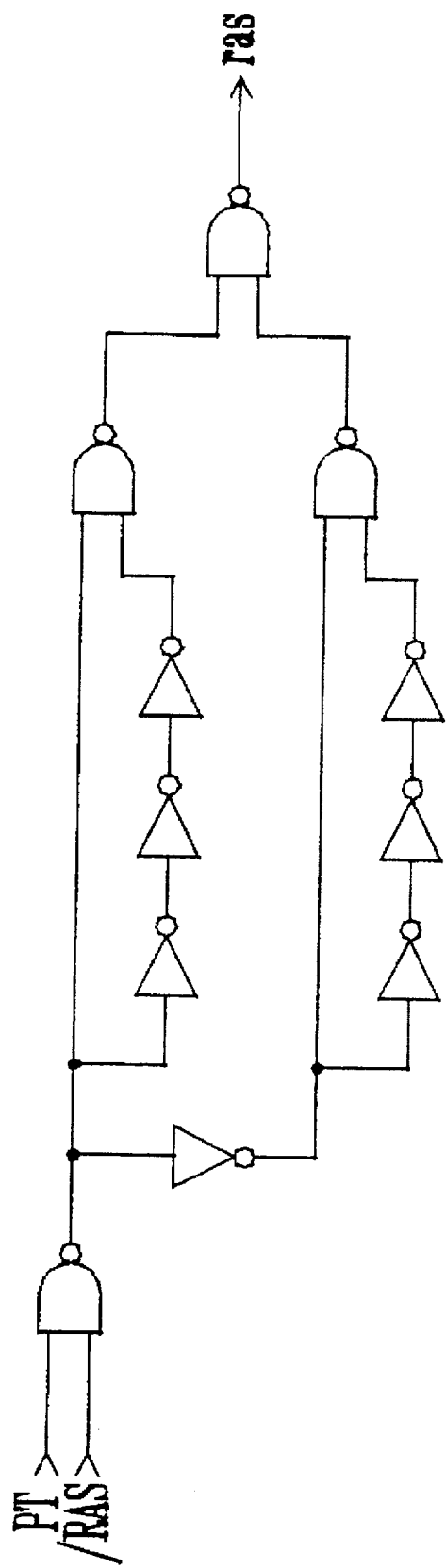
FIG. 9 is a circuit diagram of an internal row address strobe signal generator in a /RAS buffer in FIG. 7.

FIG. 9 is a circuit diagram of an internal row address strobe signal generator in the /RAS buffer 75 in FIG. 7. Whenever the external row address strobe bar signal /RAS makes a transition in logic, the internal row address strobe signal generator generates the internal row address strobe signal ras which is high in logic. To this end, the internal row address strobe signal generator includes four NAND gates and seven inverters, as shown in FIG. 9.

On the other hand, the address buffer 74 is the same in construction as the odd and even row address buffers 341 and 342 in FIGS. 5 and 6 and a detailed description thereof will thus be omitted.

Figure 10:
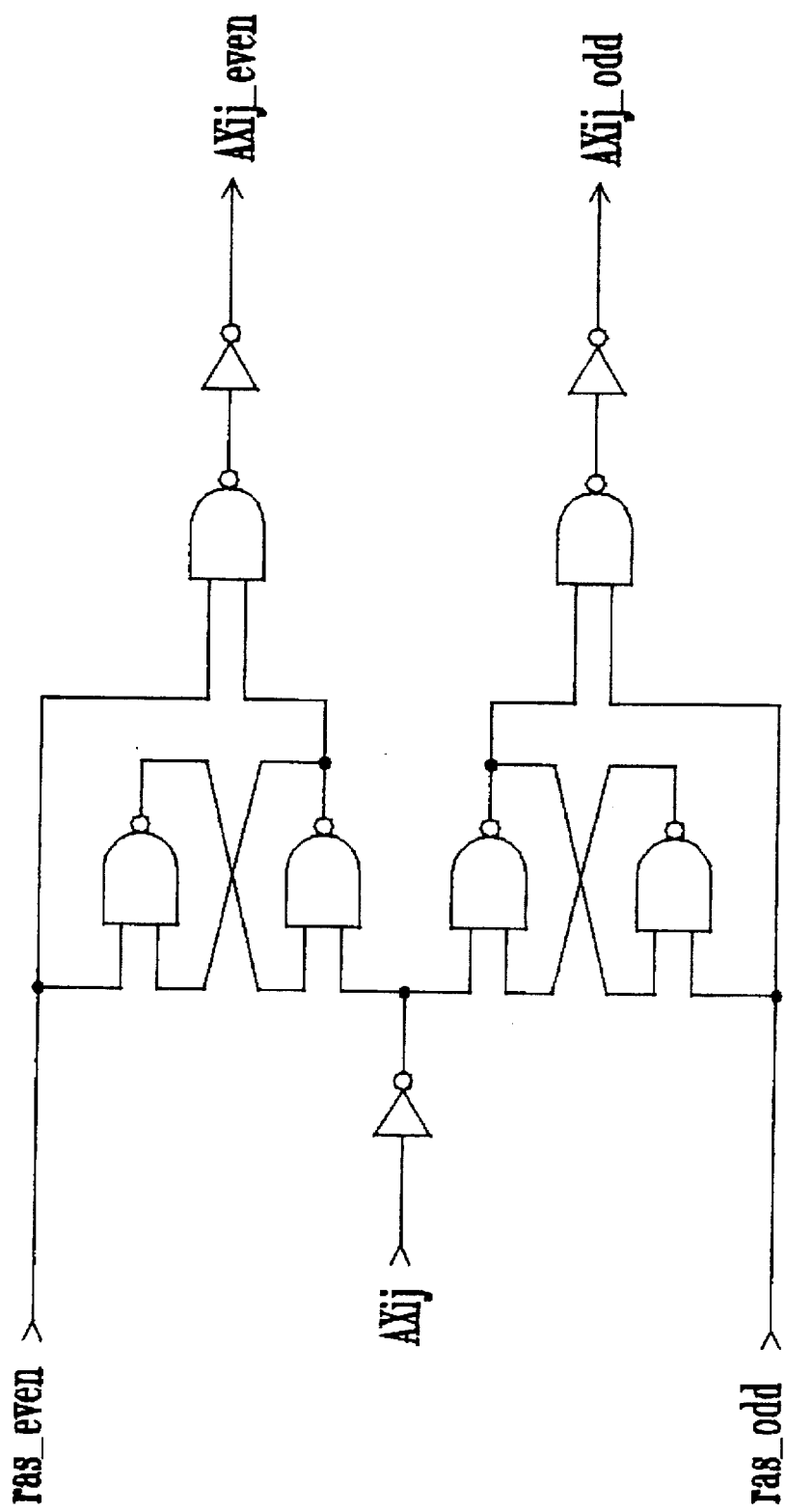
FIG. 10 is a circuit diagram of odd and even latch circuits in FIG. 7.

FIG. 10 is a circuit diagram of the odd and even latch circuits 761 and 762 in FIG. 7. The odd latch circuit 761 is adapted to generate the odd internal row address signal AXij_odd in response to the pre-decoded internal row address signal AXij from the pre-decoder 73 and the odd row address strobe signal ras_odd from the /RAS buffer 75. Also, the even latch circuit 762 is adapted to generate the even internal row address signal AXij_even in response to the pre-decoded internal row address signal AXij from the pre-decoder 73 and the even row address strobe signal ras_even from the /RAS buffer 75. To this end, each of the odd and even latch circuits 761 and 762 includes two latched NAND gates, a NAND gate and two inverters, as shown in FIG. 10.

The operation of the odd and even latch circuits 761 and 762 with the above-mentioned construction in accordance with the alternative embodiment of the present invention will hereinafter be described in detail with reference to FIG. 8.

When the external row address strobe bar signal /RAS makes a high to low transition in logic, the even row address strobe signal ras_even from the /RAS buffer 75 makes a low to high transition in logic and the odd row address strobe signal ras_odd from the /RAS buffer 75 makes a high to low transition in logic. As a result, the even latch circuit 762 supplies the pre-decoded internal row address signal AXij from the pre-decoder 73 as the even internal row address signal AXij_even to the even row decoder 712. The even internal row address signal AXij_even from the even latch circuit 762 is maintained at the given state by the even row address strobe signal ras_even from the /RAS buffer 75 even after the pre-decoded internal row address signal AXij from the pre-decoder 73 is changed from high to low in logic by the internal row address strobe signal ras from the /RAS buffer 75. Then, when the external row address strobe bar signal /RAS makes a low to high transition in logic, the even row address strobe signal ras_even from the /RAS buffer 75 makes a high to low transition in logic and the odd row address strobe signal ras_odd from the /RAS buffer 75 makes a low to high transition in logic. As a result, the even internal row address signal AXij_even from the even latch circuit 762 is disabled. Also, the odd latch circuit 761 supplies the pre-decoded internal row address signal AXij from the pre-decoder 73 as the odd internal row address signal AXij_odd to the odd row decoder 711.

In this manner, whenever the external row address strobe bar signal /RAS is toggled in logic, the odd and even internal row address signals AXij_odd and AXij_even are alternately generated in response to the external column address signal to alternately select the odd and even cell array blocks 711 and 712. Therefore, the successive data input/output operations can be performed to make the high-speed operation possible.

As is apparent from the above description, according to the present invention, the data access operation is performed whenever the external row address strobe bar signal /RAS is toggled in logic. Therefore, because only the time of tRAS is required in reading or writing one cell data, the data access time is significantly reduced as compared to the conventional time of tRAS+tRP. Such a short data access time makes high-speed operation possible and reduces the test time, resulting in a reduction in the cost in view of mass production.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device comprising:

a cell array including first and second cell array blocks for storing data therein;

a first row address buffer for generating a first internal row address signal in response to an external row address signal and a first row address strobe signal;

a second row address buffer for generating a second internal row address signal in response to the external row address signal and a second row address strobe signal;

a first pre-decoder for pre-decoding the first internal row address signal from said first row address buffer;

a second pre-decoder for pre-decoding the second internal row address signal from said second row address buffer;

a first row decoder for selectively driving word lines in said first cell array block in response to the pre-decoded first internal row address signal from said first pre-decoder; and a second row decoder for selectively driving word lines in said second cell array block in response to the pre-decoded second internal row address signal from said second pre-decoder.

2. A memory device as set forth in claim 1, further comprising control means for generating the first and second row address strobe signals in response to an external row address strobe bar signal, a column address strobe bar signal, a write enable signal, an output enable signal and a mode enable signal and applying the generated first and second row address strobe signals to said first and second row address buffers, respectively.

3. A memory device as set forth in claim 1, wherein said first and second row decoder, said first and second row address buffers and said first and second pre-decoders are alternately operated.

4. A memory device as set forth in claim 2, wherein said first row address buffer includes a first internal row address generator for generating the first internal row address signal in response to the external row address signal and the first row address strobe signal from said control means.

5. A memory device as set forth in claim 4, wherein said second row address buffer includes a second internal row address generator for generating the second internal row address signal in response to the external row address signal and the second row address strobe signal from said control means.

* * * * *